(12) United States Patent
Kwag

(10) Patent No.: US 10,840,279 B2
(45) Date of Patent: Nov. 17, 2020

(54) IMAGE SENSOR INCLUDING A PIXEL ARRAY HAVING PIXEL BLOCKS ARRANGED IN A ZIGZAG FORM

(71) Applicant: SK hynix Inc., Icheon-si (KR)

(72) Inventor: Pyong-Su Kwag, Eumseong-gun (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,771

(22) Filed: Dec. 13, 2018

(65) Prior Publication Data
US 2019/0237498 A1 Aug. 1, 2019

(30) Foreign Application Priority Data
Jan. 29, 2018 (KR) .......................... 10-2018-0010467

(51) Int. Cl.
*H01L 27/146* (2006.01)
*H04N 5/376* (2011.01)
*H04N 5/3745* (2011.01)

(52) U.S. Cl.
CPC .. *H01L 27/14605* (2013.01); *H01L 27/14603* (2013.01); *H01L 27/14614* (2013.01); *H01L 27/14641* (2013.01); *H01L 27/14643* (2013.01); *H04N 5/3765* (2013.01); *H04N 5/37455* (2013.01); *H04N 5/37457* (2013.01)

(58) Field of Classification Search
CPC ......... H01L 27/14605; H01L 27/14614; H01L 27/14643; H01L 27/14603; H01L 27/14641; H01L 27/146; H04N 5/3765; H04N 5/37455; H04N 5/37457; H04N 5/3745; H04N 5/376

USPC ....................................................... 257/431
See application file for complete search history.

(56) References Cited

U.S. PATENT DOCUMENTS

| | | | |
|---|---|---|---|
| 9,577,006 B2* | 2/2017 | Itonaga | H01L 27/14603 |
| 2006/0028565 A1* | 2/2006 | Kuwazawa | H04N 5/335 348/294 |
| 2008/0291310 A1* | 11/2008 | Ladd | H04N 5/374 348/308 |
| 2009/0140304 A1* | 6/2009 | Kudoh | H01L 27/14641 257/292 |
| 2011/0128400 A1* | 6/2011 | Wakano | H01L 27/14609 348/222.1 |

(Continued)

FOREIGN PATENT DOCUMENTS

KR 10-2018-0053916 * 5/2018

*Primary Examiner* — Alexander O Williams
(74) *Attorney, Agent, or Firm* — Perkins Coie LLP

(57) ABSTRACT

An image sensor may include a pixel array including a plurality of pixel blocks structured to convert light into electrical signals. Each of the plurality of pixel blocks may include a first light receiving circuit including a plurality of unit pixels which share a first floating diffusion; a second light receiving circuit arranged adjacent to the first light receiving circuit in a second direction, and including a plurality of unit pixels which share a second floating diffusion; a first driving circuit and a second driving circuit positioned between the first light receiving circuit and the second light receiving circuit, and aligned in a first direction crossing the second direction; and an intercoupling circuit configured to electrically couple the first floating diffusion, the second floating diffusion, the first driving circuit and the second driving circuit.

19 Claims, 6 Drawing Sheets

(56) References Cited

U.S. PATENT DOCUMENTS

| | | | |
|---|---|---|---|
| 2014/0239152 A1* | 8/2014 | Chen | H01L 27/14605 |
| | | | 250/208.1 |
| 2015/0077606 A1* | 3/2015 | Ohtsuki | H01L 27/14603 |
| | | | 348/300 |
| 2016/0093653 A1* | 3/2016 | Tatani | H01L 27/14603 |
| | | | 257/225 |
| 2016/0372504 A1* | 12/2016 | Kato | H04N 5/3745 |
| 2017/0236858 A1* | 8/2017 | Oh | H01L 27/14612 |
| | | | 257/292 |
| 2017/0366769 A1* | 12/2017 | Mlinar | H01L 27/14643 |
| 2018/0138229 A1* | 5/2018 | Lee | H01L 27/14621 |
| 2019/0007633 A1* | 1/2019 | Kwag | H01L 27/14612 |
| 2019/0027526 A1* | 1/2019 | Lee | H04N 5/37457 |
| 2019/0237496 A1* | 8/2019 | Kwag | H01L 27/14614 |
| 2019/0237497 A1* | 8/2019 | Kwag | H01L 27/14641 |

* cited by examiner

IMAGE SENSOR INCLUDING A PIXEL ARRAY HAVING PIXEL BLOCKS ARRANGED IN A ZIGZAG FORM

CROSS-REFERENCE TO RELATED APPLICATION

This patent document claims the priority and benefits of Korean Patent Application No. 10-2018-0010467 filed on Jan. 29, 2018, which is incorporated herein by reference in its entirety.

TECHNICAL FIELD

The technology and implementations disclosed in this patent document relate to an image sensor.

BACKGROUND

An image sensor is a device that receives light from an optical image or one or more objects and converts the received light into electrical signals forming an image. Recently, with the development of the computer industry and communication industry, the demand for an image sensor having improved degree of integration and performance is increasing in various fields or applications, including, e.g., a digital camera, a camcorder, a portable device such as personal communication system, a game console, a security camera, a medical micro-camera and a robot.

SUMMARY

Various embodiments provide an image sensor with improved performance.

In an embodiment, an image sensor may include a pixel array including a plurality of pixel blocks structured to convert light into electrical signals. Each of the plurality of pixel blocks may include a first light receiving circuit including a plurality of unit pixels which share a first floating diffusion; a second light receiving circuit arranged adjacent to the first light receiving circuit in a second direction, and including a plurality of unit pixels which share a second floating diffusion; a first driving circuit and a second driving circuit positioned between the first light receiving circuit and the second light receiving circuit, and aligned in a first direction crossing the second direction; and an intercoupling circuit configured to electrically couple the first floating diffusion, the second floating diffusion, the first driving circuit and the second driving circuit. The intercoupling circuit may include a first region, which couples the first driving circuit to the second driving circuit, a second region, which couples the first region to the first floating diffusion, and a third region, which couples the first region to the second floating diffusion.

In an embodiment, an image sensor may include a pixel array including a plurality of pixel blocks operable to convert light into electrical signals. Each of the plurality of pixel blocks may include a first light receiving circuit including a plurality of unit pixels which share a first floating diffusion; a second light receiving circuit arranged adjacent to the first light receiving circuit in a second direction, and including a plurality of unit pixels which share a second floating diffusion; and a first driving circuit and a second driving circuit positioned between the first light receiving circuit and the second light receiving circuit, and aligned in a first direction crossing the second direction. A portion of the second driving circuit may have a shape that extends from the first light receiving circuit and the second light receiving circuit in the first direction.

In an embodiment, an image sensor may include a pixel array including a plurality of pixel blocks converting light into electrical signals. Each of the plurality of pixel blocks may include a first light receiving circuit including a plurality of unit pixels which share a first floating diffusion; a second light receiving circuit arranged adjacent to the first light receiving circuit in a second direction, and including a plurality of unit pixels which share a second floating diffusion; and a first driving circuit and a second driving circuit positioned between the first light receiving circuit and the second light receiving circuit, and aligned in a first direction crossing the second direction. The plurality of pixel blocks may include a first pixel block to a third pixel block, which are positioned adjacent to one another, the first pixel block is adjacent to the second pixel block and the third pixel block in the first direction, the second pixel block and the third pixel block are aligned in the second direction, the first light receiving circuit and the second light receiving circuit of the first pixel block are aligned with the second light receiving circuit of the second pixel block and the first light receiving circuit of the third pixel block, respectively, in the first direction, and a portion of the second driving circuit of the first pixel block extends in the first direction and is positioned between the second light receiving circuit of the second pixel block and the first light receiving circuit of the third pixel block.

In an embodiment, an image sensor includes a pixel array including a plurality of pixel blocks each including a plurality of pixels each converting light into electrical signals. Each of the plurality of pixel blocks includes: a first light receiving circuit including a plurality of unit pixels that share a first floating diffusion; a second light receiving circuit arranged adjacent to the first light receiving circuit in a second direction, and including a plurality of unit pixels that share a second floating diffusion; a first driving circuit and a second driving circuit positioned between the first light receiving circuit and the second light receiving circuit, and aligned in a first direction crossing the second direction; and an intercoupling circuit configured to electrically couple the first floating diffusion, the second floating diffusion, the first driving circuit and the second driving circuit. The intercoupling circuit comprises a first region, which couples the first driving circuit to the second driving circuit, a second region, which couples the first region to the first floating diffusion, and a third region, which couples the first region to the second floating diffusion.

In an embodiment, an image sensor includes a pixel array including a plurality of pixel blocks each including a plurality of pixels each converting light into electrical signals. Each of the plurality of pixel blocks includes: a first light receiving circuit including a plurality of unit pixels that share a first floating diffusion; a second light receiving circuit arranged adjacent to the first light receiving circuit in a second direction, and including a plurality of unit pixels that share a second floating diffusion; and a first driving circuit and a second driving circuit positioned between the first light receiving circuit and the second light receiving circuit, and aligned in a first direction crossing the second direction, wherein a portion of the second driving circuit has a shape that extends from the first light receiving circuit and the second light receiving circuit in the first direction.

In an embodiment, an image sensor includes a pixel array including a plurality of pixel blocks each including a plurality of pixels each converting light into electrical signals. Each of the plurality of pixel blocks includes: a first light receiving circuit including a plurality of unit pixels that share a first floating diffusion; a second light receiving circuit arranged adjacent to the first light receiving circuit in a second direction, and including a plurality of unit pixels that share a second floating diffusion; and a first driving circuit and a second driving circuit positioned between the first light receiving circuit and the second light receiving circuit, and aligned in a first direction crossing the second direction. The plurality of pixel blocks comprise a first pixel block to a third pixel block, which are positioned adjacent to one another, the first pixel block is adjacent to the second pixel block and the third pixel block in the first direction, the second pixel block and the third pixel block are aligned in the second direction, the first light receiving circuit and the second light receiving circuit of the first pixel block are aligned with the second light receiving circuit of the second pixel block and the first light receiving circuit of the third pixel block, respectively, in the first direction, and a portion of the second driving circuit of the first pixel block extends in the first direction and is positioned between the second light receiving circuit of the second pixel block and the first light receiving circuit of the third pixel block.

DETAILED DESCRIPTION

The disclosed image sensing technology can be implemented to achieve high-quality, high-resolution imaging while minimizing the size of an image sensor. In order to provide a high-resolution image, the image sensor implemented based on the disclosed technology may have a shared pixel structure. However, while the shared pixel structure is easy to increase a fill factor (i.e., the ratio of pixel's light sensitive area to its total area, or the ratio of photodiode area to total pixel area), operation characteristics may deteriorate as the area of a driving circuit including pixel transistors decreases. That is to say, while the shared pixel structure may help to increase the light receiving area of a photoelectric conversion element, the performances of the pixel transistors such as driver transistor (DX), reset transistor (RX), and select transistor (ST) degrade because areas in which the pixel transistors are formed are reduced relatively. Moreover, process deviations in manufacturing of the shared pixel structure may cause the pixels to have uneven characteristics and to be vulnerable to temporal noise.

In the shared pixel structure, differences in the types and shapes of structures adjacent to respective unit pixels sharing a floating diffusion, for example, conductive lines and the pixel transistors, may also cause unit pixels to have uneven characteristics due to the overlap capacitance or parasitic capacitance induced among them.

The disclosed technology provides image sensor techniques that can be used to resolve the issues discussed above and to provide an image sensor that has a shared pixel structure to provide a high-quality, high-resolution image and at the same time is capable of maximizing the sizes of the pixel transistors within a limited area.

In this patent document, a first direction D1 may be a horizontal direction or a row direction, and a second direction D2 may be a vertical direction or a column direction. While it is illustrated in some embodiments of the disclosed technology that the first direction D1 and the second direction D2 are a row direction and a column direction, respectively, it is to be noted that the disclosed technology is not limited thereto. That is to say, the first direction D1 may be a column direction, and the second direction D2 may be a row direction.

Figure 1:
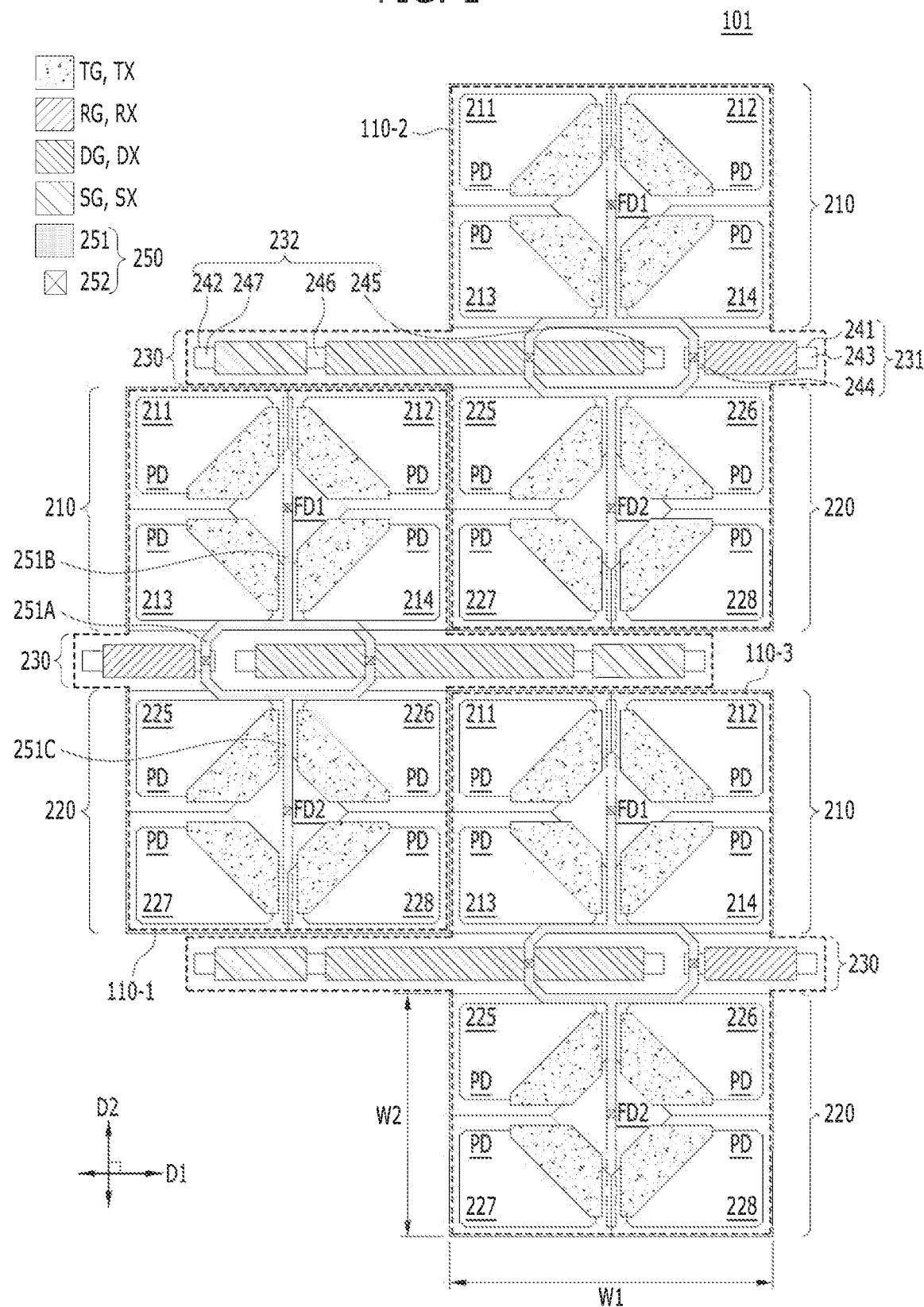
FIG. 1 is a layout illustrating an example of a sub pixel array of an image sensor based on an embodiment of the disclosed technology.

FIG. 1 is a layout illustrating an example of a sub pixel array of an image sensor based on an embodiment of the disclosed technology.

As shown in FIG. 1, the image sensor implemented based on an embodiment of the disclosed technology may include a pixel array 100-1, 100-2, 100-3 (see FIG. 3) in which a plurality of sub pixel arrays 101 are arranged. Each of the plurality of sub pixel arrays 101 may include a plurality of pixel blocks 110-1, 110-2, 110-3.

In the sub pixel array 101, the plurality of pixel blocks 110-1, 110-2, 110-3 may be arranged in a zigzag form. For example, the sub pixel array 101 may include at least three pixel blocks 110-1, 110-2, 110-3 disposed in a staggered manner with respect to one another. In this way, the image sensor implemented based on an embodiment of the disclosed technology may secure a space for pixel transistors to be formed in each of the plurality of pixel blocks 110-1, 110-2, 110-3, and may also reduce driving loads when pixel transistors operate, for example, when output signals are outputted from the pixel blocks 110-1, 110-2, 110-3.

In detail, the sub pixel array 101 may include a first pixel block 110-1 to a third pixel block 110-3 which are disposed in a zigzag form. The first pixel block 110-1 to the third pixel block 110-3 may be arranged such that the first pixel block 110-1 is adjacent to the second pixel block 110-2 and the third pixel block 110-3 in the first direction D1 and the second pixel block 110-2 and the third pixel block 110-3 are aligned in the second direction D2. The two-dimensional arrangement of the second pixel block 110-2 may be identical to the two-dimensional arrangement of the third pixel block 110-3. With respect to the boundary where the first pixel block 110-1 adjoins the second pixel block 110-2 and the third pixel block 110-3, regions of the two-dimensional arrangement of the first pixel block 110-1 and regions of the two-dimensional arrangement of the second pixel block 110-2 and the third pixel block 110-3 may be symmetrical to each other.

In the first direction D1, the upper region of the first pixel block 110-1 and the lower region of the second pixel block 110-2 are symmetrical about the boundary between them, and the lower region of the first pixel block 110-1 and the upper region of the third pixel block 110-3 are symmetrical about the boundary between them. In other words, in the first direction D1, the upper region of the first pixel block 110-1 and the lower region of the second pixel block 110-2 may be disposed side-by-side, and the lower region of the first pixel block 110-1 and the upper region of the third pixel block 110-3 may be disposed side-by-side.

Each of the plurality of pixel blocks 110 may have a shared pixel structure. For example, each of the plurality of pixel blocks 110-1, 110-2, 110-3 may have an 8-shared pixel structure. The 8-shared pixel structure may easily increase the sizes of pixel transistors compared to a 4-shared pixel structure. In detail, each of the plurality of pixel blocks 110-1, 110-2, 110-3 may include a first light receiving circuit 210 which includes a plurality of unit pixels sharing a first floating diffusion FD1, a second light receiving circuit 220 which includes a plurality of unit pixels sharing a second floating diffusion FD2, a driving circuit 230 which includes a reset transistor RX, a driver transistor DX and a selection transistor SX, and an intercoupling circuit 250 which electrically couples the first light receiving circuit 210, the second light receiving circuit 220 and the driving circuit 230. Here, the reset transistor RX, the driver transistor DX and the selection transistor SX may be referred to as pixel transistors.

In each of the plurality of pixel blocks 110-1, 110-2, 110-3, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214), which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the second direction D2. Therefore, the first floating diffusion FD1 and the second floating diffusion FD2 may also be aligned in the second direction D2. Accordingly, in some implementations, the first floating diffusion FD1 and the second floating diffusion FD2 may be positioned on the same line in the second direction D2. The first floating diffusion FD1 and the second floating diffusion FD2 may be electrically coupled to each other through the intercoupling circuit 250.

In each of the plurality of pixel blocks 110-1, 110-2, 110-3, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width in the row direction, and the second pitch W2 may be a width in the column direction. The first pitch W1 and the second pitch W2 may have the same length (W1=W2) in some implementations, and may be different in other implementations. For example, the first pitch W1 may be larger than the second pitch W2 due to the disposition of the driving circuit 230 in the pixel block 110 (W1>W2). It is illustrated in the drawings that the first pitch W1 is larger than the second pitch W2 for example.

Figure 2:
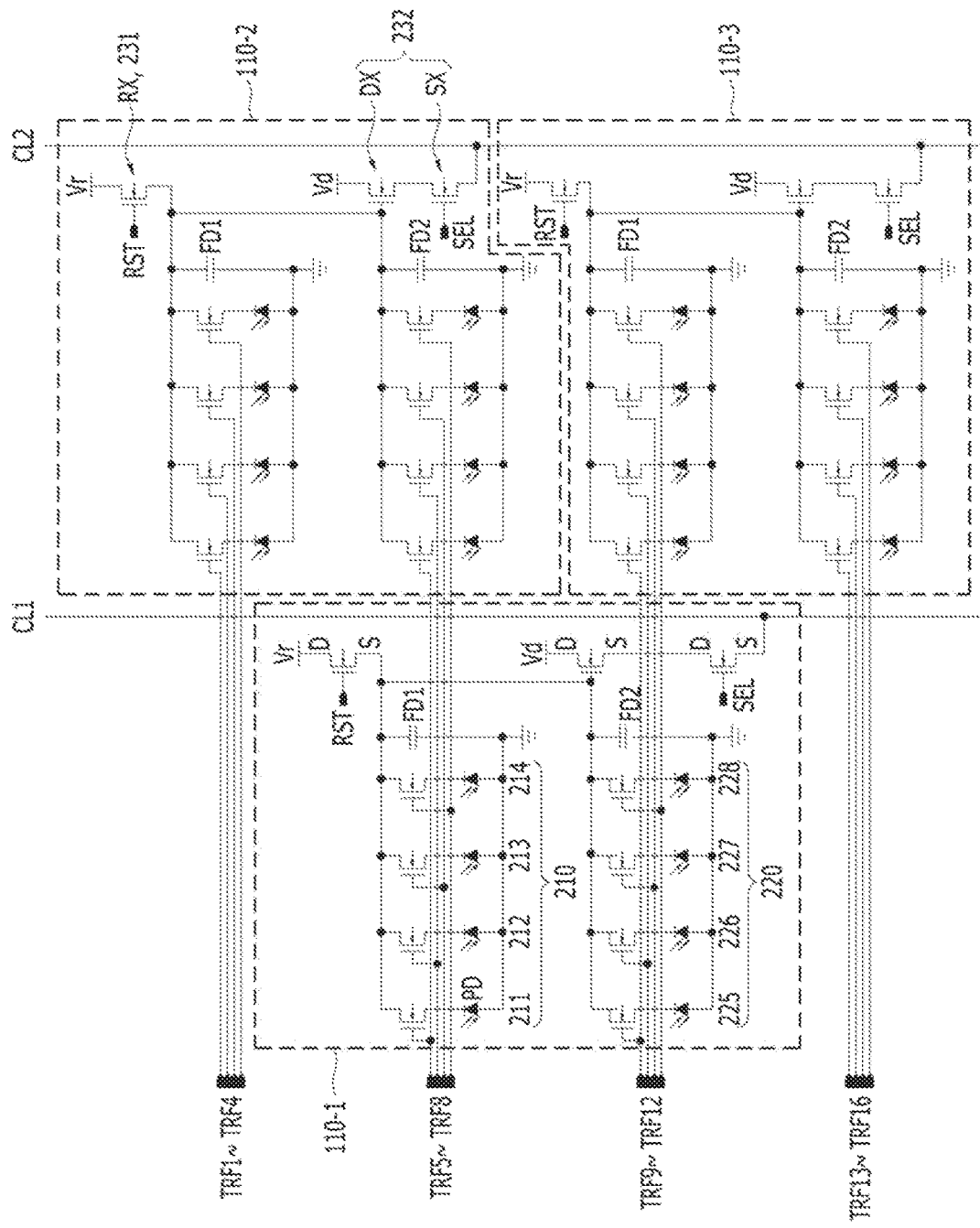
FIG. 2 is an equivalent circuit diagram corresponding to the sub pixel array of the image sensor based on an embodiment of the disclosed technology.

In each of the plurality of pixel blocks 110-1, 110-2, 110-3, each of the first unit pixel 211 to the eighth unit pixel 228 may include a photoelectric conversion element PD which generates photocharges in response to incident light and a transfer transistor TX which transfers the photocharges generated in the photoelectric conversion element PD to the floating diffusion FD in response to a transfer signal TRF (see FIG. 2). The floating diffusion FD may temporarily store the photocharges generated in the photoelectric conversion element PD. The photoelectric conversion element PD may include a photodiode, a phototransistor, a photogate, a pinned photodiode (PPD) or a combination thereof. For example, the photoelectric conversion element PD may include organic or/and inorganic photodiodes. In detail, the photoelectric conversion element PD may include either one of organic and inorganic photodiodes, or may be formed by stacking an organic photodiode and an inorganic photodiode on top of one another. The transfer signal TRF may be generated in a row driver (see the reference numeral 150 of FIG. 5), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110-1, 110-2, 110-3, the driving circuit 230 may include a first driving circuit 231 and a second driving circuit 232. The driving circuit 230 may be positioned between the first light receiving circuit 210 and the second light receiving circuit 220, and the first driving circuit 231 and the second driving circuit 232 may be aligned in the first direction D1. Namely, the first driving circuit 231 and the second driving circuit 232 may be positioned in a line in the first direction D1 between the first light receiving circuit 210 and the second light receiving circuit 220. A portion of the first driving circuit 231 and a portion of the second driving circuit 232 may have shapes that extend in the first direction D1. A direction in which the first driving circuit 231 extends and a direction in which the second driving circuit 232 extends may be opposite to each other. That is to say, the portion of the first driving circuit 231 and the portion of the second driving circuit 232 may have shapes that project out from the light receiving circuits 210 and 220 when viewed in the first direction D1. While it is illustrated in the drawings that the portion of the first driving circuit 231 projects out from the light receiving circuits 210 and 220, it is to be noted that the disclosed technology is not limited thereto. Alternatively, one end of the first driving circuit 231 may be coplanar with the ends of the light receiving circuits 210 and 220.

The first driving circuit 231 may initialize the first floating diffusion FD1, the second floating diffusion FD2, and the photoelectric conversion elements PD to remove previously accumulated charges therein in response to a reset signal RST (see FIG. 2). The second driving circuit 232 may generate an output signal corresponding to the amount of the photocharges generated in the first light receiving circuit 210 and the second light receiving circuit 220, and may output the output signal to a column line (not shown) in response to a select signal SEL (see FIG. 2) which is applied through a row line (not shown). The reset signal RST and the select signal SEL may be generated in the row driver (see the reference numeral 150 of FIG. 5), and may be applied to the reset transistor RX and the selection transistor SX through row lines (not shown) which extend from the row driver and are coupled to a reset gate RG and a selection gate SG, respectively.

The first driving circuit 231 may include the reset transistor RX. The reset transistor RX may include a first active region 241, the reset gate RG which is formed on the first active region 241, and a first junction region 243 and a second junction region 244 which are formed in the first active region 241 at both sides of the reset gate RG. The first active region 241 may have a bar shape that has a major axis extending in the first direction D1 and a minor axis extending in the second direction D2. The reset signal RST may be applied to the reset gate RG. The first junction region 243 may be the drain of the reset transistor RX. The reset transistor RX may be supplied with a reset voltage Vr through the first junction region 243. The reset voltage Vr may be a positive voltage. For example, the reset voltage Vr may be a power supply voltage (VDD) or a positive voltage larger than the power supply voltage (VDD). The second junction region 244 may be the source of the reset transistor RX. The second junction region 244 may be electrically coupled to the intercoupling circuit 250, and may be electrically coupled to the first floating diffusion FD1 and the second floating diffusion FD2 through the intercoupling circuit 250.

In each of the plurality of pixel blocks 110-1, 110-2, 110-3, the first driving circuit 231 may be positioned between the first light receiving circuit 210 and the second light receiving circuit 220, and may include the portion of the first driving circuit 231 extending in the first direction D1. That is to say, the first driving circuit 231 may have the shape in which the portion of the first driving circuit 231 projects out from the light receiving circuits 210 and 220 in the first direction D1. In other words, a portion of the reset transistor RX may be positioned outside the light receiving circuits 210 and 220. For example, a portion of the reset gate RG and the drain of the reset transistor RX which is supplied with the reset voltage Vr may be positioned outside the light receiving circuits 210 and 220. Therefore, the source of the reset transistor RX which is electrically coupled to the intercoupling circuit 250 may be positioned between the first light receiving circuit 210 and the second light receiving circuit 220 of the pixel block 110-1, 110-2, or 110-3 including the reset transistor RX. While not shown in the drawing, the projecting portion of the first driving circuit 231 may be positioned between the light receiving circuits 210 and 220 of other pixel blocks 110, which are adjacent to the pixel block 110 including the first driving circuit 231. The shape of the first driving circuit 231 described above makes it easy to provide a space for pixel transistors to be formed, thereby lowering the level of difficulty in designing power lines that supply the reset voltage Vr.

The second driving circuit 232 may include the driver transistor DX and the selection transistor SX. In the second driving circuit 232, the driver transistor DX and the selection transistor SX may be coupled in series. The driver transistor DX may have a channel length corresponding to the first pitch W1 of the light receiving circuits 210 and 220 to effectively prevent noise from causing characteristic degradation. The driver transistor DX and the selection transistor SX, which are coupled in series, may share a second active region 242. The driver transistor DX and the selection transistor SX may include a driver gate DG and the selection gate SG, respectively, which are formed on the second active region 242. The second active region 242 may have a bar shape that has a major axis extending in the first direction D1 and a minor axis extending in the second direction D2. The driver gate DG may have a length corresponding to the first pitch W1, and may be electrically coupled to the first floating diffusion FD1, the second floating diffusion FD2 and the source of the reset transistor RX through the intercoupling circuit 250, A row line (not shown) may be coupled to the selection gate SG, Junction regions may be formed in the second active region 242 at both sides of the driver gate DG and the selection gate SG. A third junction region 245 may be formed in the second active region 242 at one side of the driver gate DG. A fourth junction region 246 may be formed in the second active region 242 at the other side of the driver gate DG between the driver gate DG and one side of the selection gate SG. A fifth junction region 247 may be formed in the second active region 242 at the other side of the selection gate SG. The third junction region 245 may be the drain of the driver transistor DX. The driver transistor DX may be supplied with a driver voltage Vd through the third junction region 245. The driver voltage Vd may be a positive voltage. For example, the driver voltage Vd may be the power supply voltage (VDD) or another positive voltage larger than the power supply voltage (VDD). The fourth junction region 246 may be the source of the driver transistor DX and the drain of the selection transistor SX. The fifth junction region 247 may be the source of the selection transistor SX. The fifth junction region 247 may be coupled to a column line (not shown), and an output signal may be transferred to the column line through the fifth junction region 247. Because the first driving circuit 231 and the second driving circuit 232 are separated from each other, a power line that supplies the driver voltage Vd to the driver transistor DX and another power line that supplies the reset voltage Vr to the reset transistor RX may be separated. Accordingly, those two power lines may be designed separately, and thus, when the first driving circuit 231 and the second driving circuit 232 operate, driving loads may be effectively reduced.

In each of the plurality of pixel blocks 110-1, 110-2, 110-3, the second driving circuit 232 may be positioned between the first light receiving circuit 210 and the second light receiving circuit 220, and may include the portion of the second driving circuit 232 extending in the first direction D1. In other words, the portion of the second driving circuit 232 may be positioned outside the light receiving circuits 210 and 220. For example, a portion of the driver transistor DX and the selection transistor SX may be positioned outside the light receiving circuits 210 and 220. Because the driver transistor DX and the selection transistor SX are coupled in series, the drain of the driver transistor DX, which is supplied with the driver voltage Vd, may be positioned between the first light receiving circuit 210 and the second light receiving circuit 220 of the pixel block 110-1, 110-2, or 110-3 including the driver transistor DX. The projecting portion of the second driving circuit 232 may be positioned between the light receiving circuits 210 and 220 of pixel blocks 110, which are adjacent to the pixel block 110 including the second driving circuit 232. For example, the portion of the driver transistor DX and the selection transistor SX in the first pixel block 110-1 may be positioned between the second light receiving circuit 220 of the second pixel block 110-2 and the first light receiving circuit 210 of the third pixel block 110-3. The shape of the second driving circuit 232 described above makes it easy to provide a space for pixel transistors to be formed, thereby reducing driving loads when the first driving circuit 231 and the second driving circuit 232 operate. Also, the shape of the second driving circuit 232 described may decrease the level of difficulty in designing power lines that supply the driver voltage Vd.

In each of the plurality of pixel blocks 110, the intercoupling circuit 250 may electrically coupe the first floating diffusion FD1 of the first light receiving circuit 210, the second floating diffusion FD2 of the second light receiving circuit 220, the source of the reset transistor RX of the first driving circuit 231 and the driver gate DG of the second driving circuit 232 to each other. Thus, the intercoupling circuit 250 may include a conductive line 251 and contacts 252, which couple the conductive line 251 to the first floating diffusion FD1, the second floating diffusion FD2, the source of the reset transistor RX, and the driver gate DG.

The conductive line 251 may include a first region 251A, which is positioned between the first light receiving circuit 210 and the second light receiving circuit 220 and couples the source of the reset transistor RX of the first driving circuit 231 to the driver gate DG of the second driving circuit 232, a second region 251B, which electrically couples the first regions 251A to the first floating diffusion FD1, and a third region 251C, which electrically couples the first region 251A to the second floating diffusion FD2. Various embodiments of the disclosed technology may prevent characteristic degradation that would be caused by the shape of the intercoupling circuit 250. By controlling the parasitic capacitances existing between the intercoupling circuit 250 and the plurality of unit pixels (e.g., the first unit pixel 211 to the eighth unit pixel 228) to have a constant value, it is possible to allow the plurality of unit pixels to have uniform characteristics.

In an embodiment of the disclosed technology, the first region 251A may have a ring-type shape. For example, the first region 251A may include a first coupling part and a second coupling part to couple the first driving circuit 231 to the second driving circuit 232. The first coupling part may indicate an upper portion of the first region 251A which has the ring-type shape, and may be coupled to the second region 251B. The second coupling part may indicate a lower portion of the first region 251A which has the ring-type shape, and may be coupled to the third region 251C. In this way, the source of the reset transistor RX may be electrically coupled to the driver gate DG while being symmetrical in both the first and second directions D1 and D2. For example, in the first direction D1, the first region 251A may be symmetrical about a virtual line connecting the center of the first floating diffusion FD1 to the center of the second floating diffusion FD2. Each of the second region 251B and the third region 251C may have a line shape that extends in the second direction D2. The second region 251B and the third region 251C may overlap with the virtual line connecting the center of the first floating diffusion FD1 to the center of the second floating diffusion FD2. The second region 251B and the third region 251C may have substantially the same length.

In order to effectively prevent characteristic degradation that might be caused by the presence of the intercoupling circuit 250, the second region 251B and the third region 251C may include expanded regions (shown by the dash-dotted lines in FIG. 1), respectively, extending from the first floating diffusion FD1 and the second floating diffusion FD2 in the second direction D2. The expanded region of the second region 251B may be positioned between the first unit pixel 211 and the second unit pixel 212, and the expanded region of the third region 251C may be positioned between the seventh unit pixel 227 and the eighth unit pixel 228.

As described above, in the image sensor implemented based on an embodiment of the disclosed technology, since the first light receiving circuit 210 and the second light receiving circuit 220 are aligned in the second direction D2, and the driving circuit 230 positioned therebetween extends in the first direction D1, it is possible to easily increase the sizes of the pixel transistors to provide the pixel transistors having maximum sizes within a limited area.

Also, since the intercoupling circuit 250 has a shape that is symmetrical in both the first and second directions D1 and D2, the operation characteristics of the image sensor may be improved.

Moreover, in the sub pixel array 101 and the pixel array 100 in which the plurality of pixel blocks 110 are arranged, the arrangement of the plurality of pixel blocks 110 disposed in a zigzag form makes better use of the space where the pixel transistors are to be formed, thereby reducing the driving loads of the pixel transistors.

FIG. 2 is an equivalent circuit diagram corresponding to the sub pixel array of the image sensor based on an embodiment of the disclosed technology. A method of reducing the driving loads of driving circuits by disposing a plurality of pixel blocks in a zigzag form will be described with reference to FIGS. 1 and 2.

Referring to FIGS. 1 and 2, the plurality of pixel blocks 110-1, 110-2, or 110-3 are arranged in a zigzag form in the sub pixel array 101. Therefore, the first light receiving circuit 210 of the second pixel block 110-2 may be activated in response to a first transfer signal TRF1 to a fourth transfer signal TRF4, The first light receiving circuit 210 of the first pixel block 110-1 and the second light receiving circuit 220 of the second pixel block 110-2 may be simultaneously activated in response to a fifth transfer signal TRF5 to an eighth transfer signal TRF8. This is because the first light receiving circuit 210 of the first pixel block 110-1 and the second light receiving circuit 220 of the second pixel block 110-2 are arranged in the first direction D1 in which row lines extend to receive transfer signals TRF. Similarly, the second light receiving circuit 220 of the first pixel block 110-1 and the first light receiving circuit 210 of the third pixel block 110-3 may be simultaneously activated in response to a ninth transfer signal TRF9 to a twelfth transfer signal TRF12. The second light receiving circuit 220 of the third pixel block 110-3 may be activated in response to a thirteenth transfer signal TRF13 to a sixteenth transfer signal TRF16.

Where the fifth transfer signal TRF5 to the eighth transfer signal TRF8 are applied to the sub pixel array 101, at a timing at which the fifth transfer signal TRF5 to the eighth transfer signal TRF8 are applied to the respective light receiving circuits 210 and 220, only four unit pixels, among the total eight unit pixels in each of the first pixel block 110-1 and the second pixel block 110-2, may operate. For example, in response to the fifth transfer signal TRF5 to the eighth transfer signal TRF8, the first pixel block 110-1 may sequentially transfer the photocharges generated in the first unit pixel 211 to the fourth unit pixel 214 to the first floating diffusion FD1, and the second pixel block 110-2 may sequentially transfer the photocharges generated in the fifth unit pixel 225 to the eighth unit pixel 228 to the second floating diffusion FD2. As a result, when outputting output signals such as image signals and image reset signals, in each pixel block 110, driving loads may decrease.

In detail, at the timing at which the fifth transfer signal TRF5 to the eighth transfer signal TRF8 are applied, because only four unit pixels, among the total eight unit pixels in each of the first pixel block 110-1 and the second pixel block 110-2, operate, the image sensor implemented based on an embodiment of the disclosed technology may reduce by one half the amount of current to be applied to signal lines for applying input signals such as the reset signal RST and the select signal SEL to the first driving circuit 231 and the second driving circuit 232. Also, the image sensor implemented based on an embodiment of the disclosed technology may reduce by one half the amount of current of power lines for supplying the reset voltage Vr and the driver voltage Vd to the first driving circuit 231 and the second driving circuit 232. In this way, the driving loads of the first driving circuit 231 and the second driving circuit 232 may decrease. The signal lines for applying the reset signal RST and the select signal SEL may indicate row lines coupled to the reset gate RG and the selection gate SG, respectively.

At the timing at which the fifth transfer signal TRF5 to the eighth transfer signal TRF8 are applied, since the output signal of the first pixel block 110-1 is outputted to a first column line CL1 and the output signal of the second pixel block 110-2 is outputted to a second column line CL2, the image sensor implemented based on an embodiment of the disclosed technology may reduce by one half the amount of current to be applied to the column lines CL1 and CL2. In this way, the driving loads of a correlated double sampling (see the reference numeral 120 of FIG. 5) and an analog-digital converter (see the reference numeral 130 of FIG. 5) which are coupled to column lines may decrease.

Figure 3:
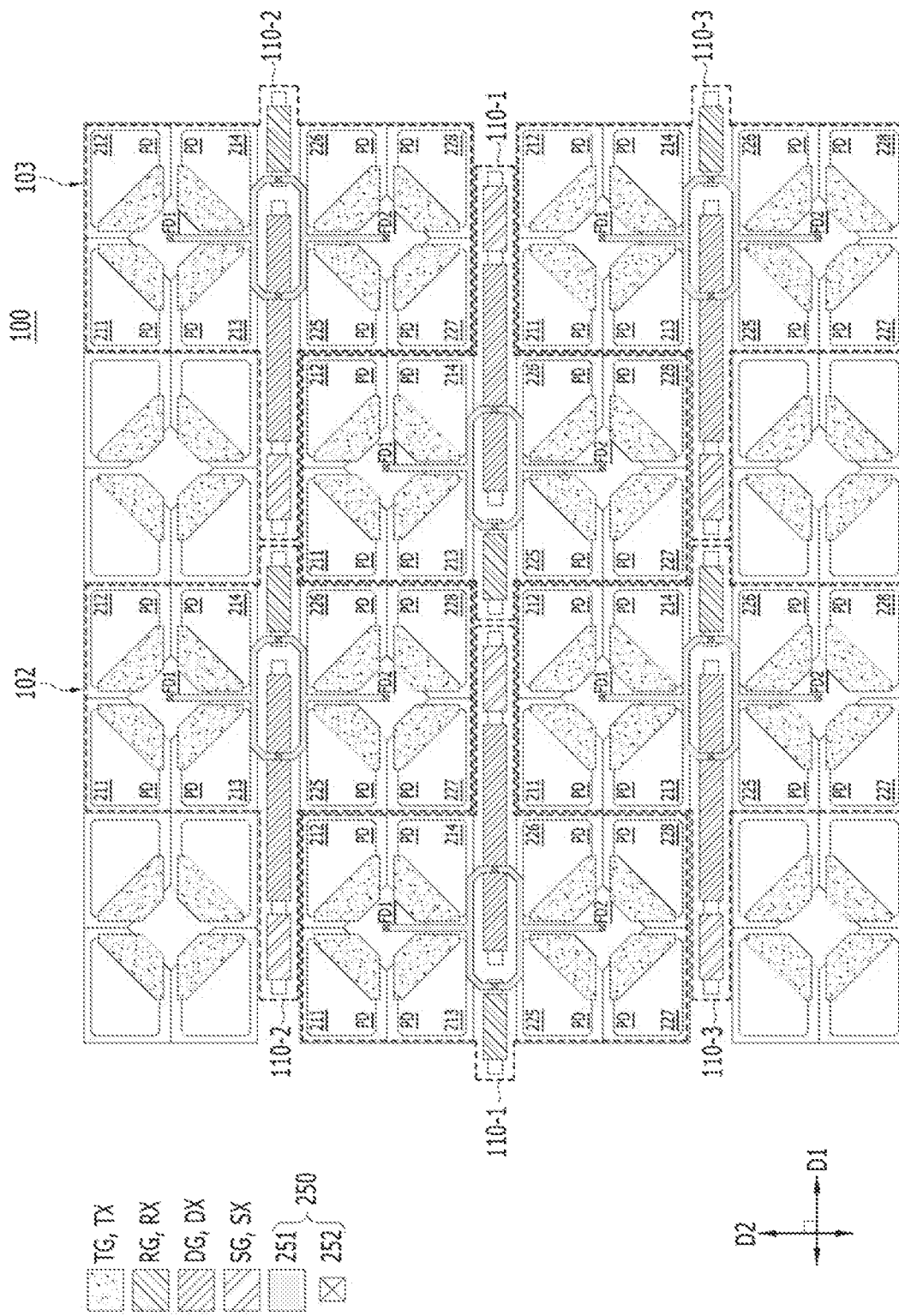
FIG. 3 is a layout illustrating an example of a pixel array of an image sensor based on an embodiment of the disclosed technology.

FIG. 3 is a layout illustrating an example of a pixel array of an image sensor based on an embodiment of the disclosed technology. The pixel array in FIG. 3 shows an example where the pixel blocks and the sub pixel array are arranged as shown in FIG. 1.

As shown in FIGS. 1 to 3, a pixel array 100 may include a plurality of sub pixel arrays 102 and 103. Each of the plurality of sub pixel arrays 102 and 103 may include a plurality of pixel blocks 110-1, 110-2, and 110-3, which are disposed in a zigzag form. That is to say, the pixel array 100 may include a plurality of pixel blocks 110 which are disposed in a zigzag form.

In the pixel array 100, pixel blocks 110 arranged in the second direction D2 (e.g., along the same column) may have the same two-dimensional arrangement. For example, pixel blocks 110 arranged along the same line in the second direction D2 (e.g., along the same column) may have the same two-dimensional arrangement. The two-dimensional arrangement of pixel blocks 110 positioned along an odd-numbered line extending in the second direction D2 (e.g., an odd-numbered column) and the two-dimensional arrangement of pixel blocks 110 which are positioned along an even-numbered line extending in the second direction D2 (e.g., an even-numbered column) may be symmetrical to each other in the first direction D1.

Each of the plurality of sub pixel arrays 102 and 103 may include a first pixel block 110-1 to a third pixel block 110-3, which are disposed adjacent to one another. The first pixel block 110-1 may be adjacent to the second pixel block 110-2 and the third pixel block 110-3 in the first direction D1, and the second pixel block 110-2 and the third pixel block 110-3 may be aligned in the second direction D2. The first light receiving circuit 210 of the first pixel block 110-1 may be aligned with the second light receiving circuit 220 of the second pixel block 110-2 in the first direction D1, and the second light receiving circuit 220 of the first pixel block 110-1 may be aligned with the first light receiving circuit 210 of the third pixel block 110-3 in the first direction D1. A portion of the second driving circuit 232 of the first pixel block 110-1 (e.g., a portion of a driver transistor DX and a selection transistor SX) may be positioned between the second light receiving circuit 220 of the second pixel block 110-2 and the first light receiving circuit 210 of the third pixel block 110-3.

Any one of the sub pixel arrays 102 and 103 (e.g., a first sub pixel array 102, and a second sub pixel array 103 which is adjacent to the first sub pixel array 102 in the first direction D1) may have asymmetrical two-dimensional arrangement with respect to the boundary where they adjoin each other.

As described above, as the plurality of pixel blocks 110-1, 110-2, or 110-3 are disposed in a zigzag form in the pixel array 100, it is possible to dispose driving circuits 230, which operate at the same timing, in a zigzag order. In this way, characteristic deterioration due to the interference between adjacent driving circuits 230 may be minimized.

Figure 4:
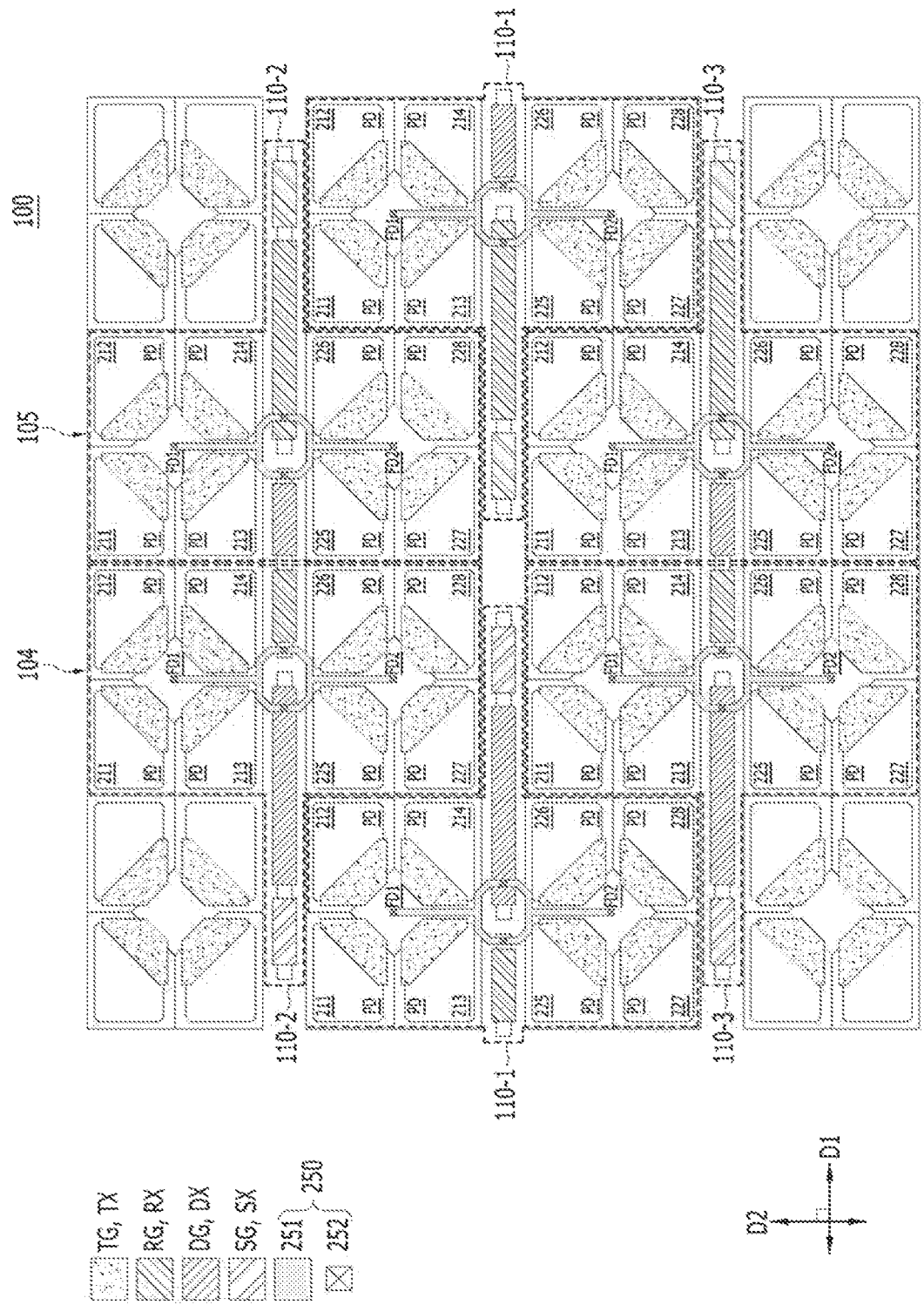
FIG. 4 is a layout illustrating an example of a pixel array of an image sensor based on another embodiment of the disclosed technology.

FIG. 4 is a layout illustrating an example of a pixel array of an image sensor based on another embodiment of the disclosed technology. The pixel array in FIG. 4 shows an example where the pixel blocks and the sub pixel array are arranged as shown in FIG. 1.

As shown in FIGS. 1 and 4, a pixel array 100 may include a plurality of sub pixel arrays 104 and 105. Each of the plurality of sub pixel arrays 104 and 105 may include a plurality of pixel blocks 110 which are disposed in a zigzag form. That is to say, the pixel array 100 may include a plurality of pixel blocks 110 which are disposed in a zigzag form.

In the pixel array 100, pixel blocks 110-1, 110-2, or 110-3 arranged in the second direction D2 may have the same two-dimensional arrangement. For example, pixel blocks 110-1, 110-2, or 110-3 arranged along the same line in the second direction D2 (e.g., along the same column) may have the same two-dimensional arrangement. The two-dimensional arrangement of pixel blocks 110 positioned along an odd-numbered line extending in the second direction D2 (e.g., an odd-numbered column) and the two-dimensional arrangement of pixel blocks 110-1, 110-2, or 110-3 which are positioned along an even-numbered line extending in the second direction D2 (e.g., an even-numbered column) may be symmetrical to each other in the first direction D1.

Each of the plurality of sub pixel arrays 104 and 105 may include a first pixel block 110-1 to a third pixel block 110-3 which are disposed adjacent to one another. The first pixel block 110-1 may be adjacent to the second pixel block 110-2 and the third pixel block 110-3 in the first direction D1, and the second pixel block 110-2 and the third pixel block 110-3 may be aligned in the second direction D2. The first light receiving circuit 210 of the first pixel block 110-1 may be aligned with the second light receiving circuit 220 of the second pixel block 110-2 in the first direction D1, and the second light receiving circuit 220 of the first pixel block 110-1 may be aligned with the first light receiving circuit 210 of the third pixel block 110-3 in the first direction D1. A driver transistor DX and a selection transistor SX of the first pixel block 110-1 of the first sub pixel block 102 may be adjacent to a reset transistor RX of the first pixel block 110-1 of the second sub pixel block 103 in the first direction D1, and the selection transistor SX of the first pixel block 110-1 may be positioned between the second light receiving circuit 220 of the second pixel block 110-2 and the first light receiving circuit 210 of the third pixel block 110-3.

Any one of the sub pixel arrays 104 and 105 (e.g., a first sub pixel array 104, and a second sub pixel array 105 which is adjacent to the first sub pixel array 104 in the first direction D1) may have symmetrical two-dimensional arrangement with respect to the boundary where they adjoin each other. In this way, reset transistors RX may be positioned adjacent to the boundary where the first sub pixel array 104 and the second sub pixel array 105 adjoin each other, and the drain of the reset transistors RX, which is supplied with the reset voltage Vr, may be shared. For example, the second pixel block 110-2 of the first sub pixel array 104 and the second pixel block 110-2 of the second sub pixel array 105 may be symmetrical with respect to the boundary where the first sub pixel array 104 and the second sub pixel array 105 adjoin each other, and the reset transistors RX thereof may have shapes which face each other. Therefore, the reset transistor RX, which is positioned in the second pixel block 110-2 of the first sub pixel array 104, and the reset transistor RX, which is positioned in the second pixel block 110-2 of the second sub pixel array 105, may share a drain. The shared drain of the reset transistors RX may be positioned at the boundary where the first sub pixel array 104 and the second sub pixel array 105 adjoin each other.

As described above, since adjacent sub pixel arrays in the pixel array 100 have two-dimensional arrangement symmetrical with respect to the boundary where they adjoin each other, it is possible to provide driving circuits 230 sharing the drain of the reset transistors RX. In this way, it is possible to effectively provide a space where pixel transistors are to be formed.

Figure 5:
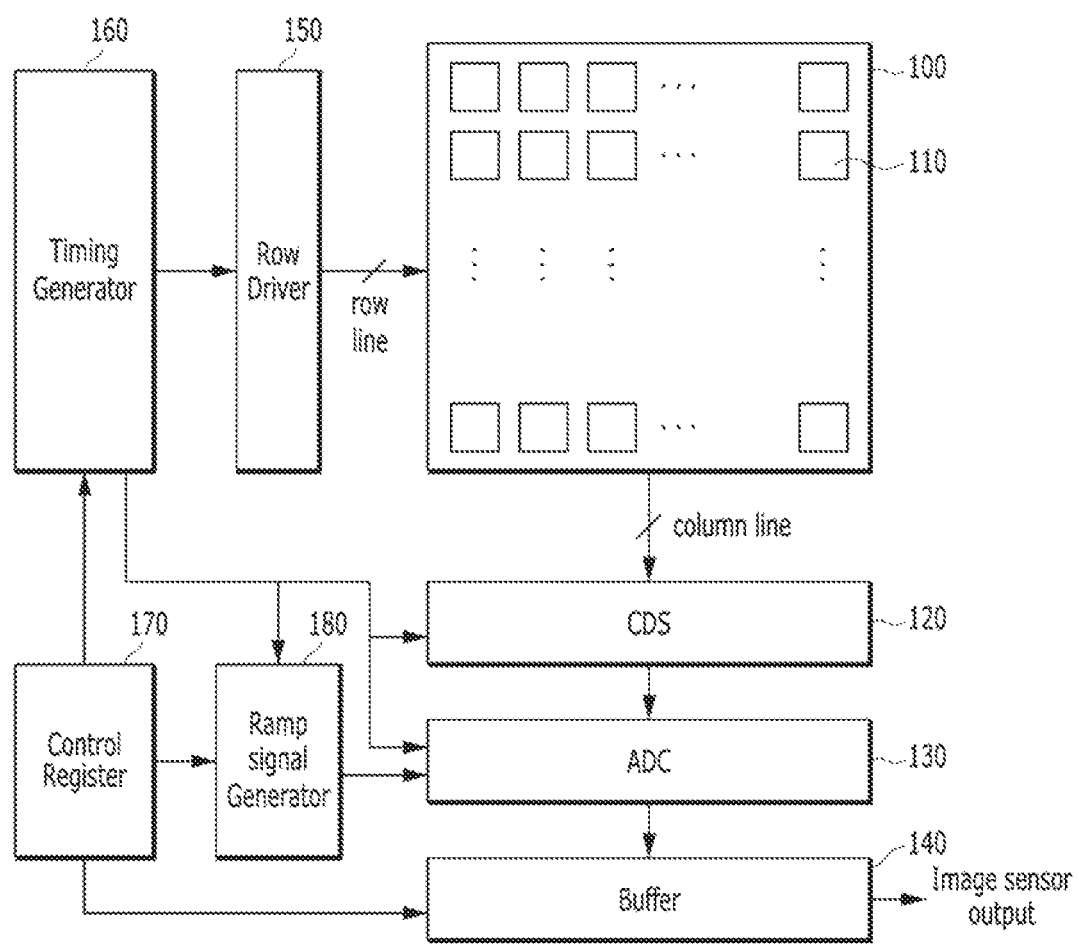
FIG. 5 is a block diagram schematically illustrating an example of an image sensor based on an embodiment of the disclosed technology.

FIG. 5 is a block diagram schematically illustrating an example of an image sensor based on an embodiment of the disclosed technology.

As shown in FIG. 5, the image sensor may include a pixel array 100 in which a plurality of pixel blocks 110 are arranged in a matrix structure, a correlated double sampling (CDS) 120, an analog-digital converter (ADC) 130, a buffer 140, a row driver 150, a timing generator 160, a control register 170, and a ramp signal generator 180.

The timing generator 160 generates one or more control signals for controlling the respective operations of the row driver 150, the correlated double sampling 120, the analog-digital converter 130 and the ramp signal generator 180. The control register 170 generates one or more control signals for controlling the respective operations of the ramp signal generator 180, the timing generator 160 and the buffer 140.

The row driver 150 drives the pixel array 100 on a row line basis. For example, the row driver 150 may generate a select signal for selecting any one row line among a plurality of row lines. Each of the plurality of row lines is coupled to a plurality of pixel blocks 110. Each of the plurality of pixel blocks 110 is coupled to one row line.

Each of the plurality of pixel blocks 110 senses incident light, and outputs an image reset signal and an image signal to the correlated double sampling 120 through a column line. The correlated double sampling 120 performs sampling for each of the image reset signal and the image signal received therein. Each of a plurality of column lines is coupled to a plurality of pixel blocks 110. Each of the plurality of pixel blocks 110 is coupled to one column line. The analog-digital converter 130 compares a ramp signal, which is outputted from the ramp signal generator 180, and a sampling signal, which is outputted from the correlated double sampling 120, and outputs a comparison signal. The analog-digital converter 130 counts a number of clock signals provided from the timing generator 160 based on a transition time of the comparison signal, and outputs a count value to the buffer 140. The ramp signal generator 180 may operate under control of the timing generator 160.

The buffer 140 stores a plurality of digital signals outputted from the analog-digital converter 130, senses and amplifies the respective digital signals, and outputs resultant signals. Thus, the buffer 140 may include a memory (not shown) and a sense amplifier (not shown). The memory stores count values, and the count values mean the count values associated with the signals outputted from the plurality of pixel blocks 110. The sense amplifier senses and amplifies the respective count values outputted from the memory.

The image sensor discussed above may be used in various electronic devices or systems. For example, the image sensor implemented based on various embodiments of the disclosed technology may be applied to a camera as illustrated in FIG. 6.

Figure 6:
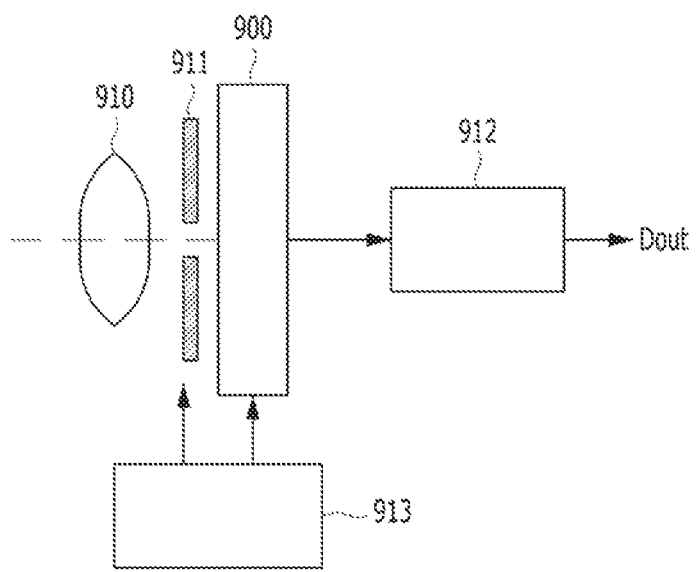
FIG. 6 is a diagram schematically illustrating an example of an electronic device including the image sensor based on some embodiments of the disclosed technology.

FIG. 6 is a diagram schematically illustrating an example of an electronic device including the image sensor implemented based on some embodiments of the disclosed technology.

Referring to FIG. 6, the electronic device including the image sensor implemented based on various embodiments of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 5) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

As is apparent from the above descriptions, in various embodiments of the disclosed technology, since a first light receiving circuit and a second light receiving circuit are aligned in a second direction and a driving circuit positioned therebetween has a shape extending in a first direction, it is possible to easily increase the sizes of pixel transistors to provide the pixel transistors having maximum sizes within a limited area.

Also, since an intercoupling circuit has a shape that is symmetrical in both the first and second directions, the operation characteristics of an image sensor may be improved.

Moreover, in a sub pixel array and a pixel array in which a plurality of pixel blocks are arranged, the arrangement of the plurality of pixel blocks disposed in a zigzag form makes better use of the space where the pixel transistors are to be formed, thereby reducing the driving loads of the pixel transistors.

Further, in the sub pixel array and the pixel array in which a plurality of pixel blocks are arranged, since pixel transistors which perform the same function are disposed in a staggered manner with respect to one another, it is possible to minimize characteristic degradation that might be caused by interference.

Although various embodiments have been described for illustrative purposes, it will be apparent to those skilled in the art that various changes and modifications may be made without departing from the spirit and scope of the invention as defined in the following claims.

What is claimed is:
1. An image sensor comprising:
  a pixel array including a plurality of pixel blocks structured to convert light into electrical signals, each of the plurality of pixel blocks comprising:
  a first light receiving circuit including a plurality of unit pixels which share a first floating diffusion;
  a second light receiving circuit arranged adjacent to the first light receiving circuit in a second direction, and including a plurality of unit pixels which share a second floating diffusion;
  a first driving circuit and a second driving circuit positioned between the first light receiving circuit and the second light receiving circuit, and aligned in a first direction crossing the second direction; and an intercoupling circuit configured to electrically couple the first floating diffusion, the second floating diffusion, the first driving circuit and the second driving circuit, wherein the intercoupling circuit comprises a first region, which couples the first driving circuit to the second driving circuit, a second region, which couples the first region to the first floating diffusion, and a third region, which couples the first region to the second floating diffusion, wherein the pixel array comprises a plurality of sub pixel arrays, wherein each of the plurality of sub pixel arrays comprises first to third pixel blocks positioned adjacent to one another, among the plurality of pixel blocks, wherein the first pixel block is adjacent to the second pixel block and the third pixel block in the first direction, and the second pixel block and the third pixel block are aligned in the second direction, and wherein the first light receiving circuit of the first pixel block is aligned with the second light receiving circuit of the second pixel block in the first direction, and the second light receiving circuit of the first pixel block is aligned with the first light receiving circuit of the third pixel block in the first direction.

2. The image sensor according to claim 1, wherein the first region comprises a first coupling part and a second coupling part, which couple the first driving circuit to the second driving circuit, and wherein the first coupling part is coupled to the second region, and the second coupling part is coupled to the third region.

3. The image sensor according to claim 2, wherein the first region has a ring-type shape.

4. The image sensor according to claim 1, wherein the first region has a symmetrical shape with respect to a virtual line that connects a center of the first floating diffusion to a center of the second floating diffusion.

5. The image sensor according to claim 1, wherein the second region and the third region have line shapes that extends in the second direction, and have substantially the same length.

6. The image sensor according to claim 1, wherein the second region and the third region overlap with the virtual line connecting the center of the first floating diffusion and the center of the second floating diffusion.

7. The image sensor according to claim 1, wherein the first driving circuit comprises a reset transistor, and the second driving circuit comprises a driver transistor and a selection transistor coupled in series to the driver transistor.

8. The image sensor according to claim 7, wherein the driver transistor is positioned closer to the first light receiving circuit and the second light receiving circuit than the selection transistor.

9. An image sensor comprising:
a pixel array including a plurality of pixel blocks structured to convert light into electrical signals, each of the plurality of pixel blocks comprising:
a first light receiving circuit including a plurality of unit pixels which share a first floating diffusion;
a second light receiving circuit arranged adjacent to the first light receiving circuit in a second direction, and including a plurality of unit pixels which share a second floating diffusion;
a first driving circuit and a second driving circuit positioned between the first light receiving circuit and the second light receiving circuit, and aligned in a first direction crossing the second direction; and an intercoupling circuit configured to electrically couple the first floating diffusion, the second floating diffusion, the first driving circuit and the second driving circuit, wherein the intercoupling circuit comprises a first region, which couples the first driving circuit to the second driving circuit, a second region, which couples the first region to the first floating diffusion, and a third region, which couples the first region to the second floating diffusion, wherein pixel blocks arranged along the same line in the second direction have the same two-dimensional arrangement, and two-dimensional arrangements of pixel blocks arranged along an odd-numbered line in the second direction are symmetrical to two-dimensional arrangements of pixel blocks arranged along an even-numbered line in the second direction.

10. The image sensor according to claim 1, wherein, among the plurality of sub pixel arrays, a first sub pixel array and a second sub pixel array, which is adjacent to the first sub pixel array in the first direction, have two-dimensional arrangements asymmetrical with respect to a boundary where they adjoin each other.

11. The image sensor according to claim 1, wherein, among the plurality of sub pixel arrays, a first sub pixel array and a second sub pixel array, which is adjacent to the first sub pixel array in the first direction, have two-dimensional arrangements symmetrical with respect to a boundary where they adjoin each other.

12. The image sensor according to claim 11, further comprising reset transistors positioned adjacent to the boundary where the first sub pixel array and the second sub pixel array adjoin each other, the reset transistors sharing a drain supplied with a reset voltage.

13. The image sensor according to claim 9, wherein the first region comprises a first coupling part and a second coupling part, which couple the first driving circuit to the second driving circuit, and wherein the first coupling part is coupled to the second region, and the second coupling part is coupled to the third region.

14. The image sensor according to claim 13, wherein the first region has a ring-type shape.

15. The image sensor according to claim 9, wherein the first region has a symmetrical shape with respect to a virtual line that connects a center of the first floating diffusion to a center of the second floating diffusion.

16. The image sensor according to claim 9, wherein the second region and the third region have line shapes that extends in the second direction, and have substantially the same length.

17. The image sensor according to claim 9, wherein the second region and the third region overlap with the virtual line connecting the center of the first floating diffusion and the center of the second floating diffusion.

18. The image sensor according to claim 9, wherein the first driving circuit comprises a reset transistor, and the second driving circuit comprises a driver transistor and a selection transistor coupled in series to the driver transistor.

19. The image sensor according to claim 18, wherein the driver transistor is positioned closer to the first light receiving circuit and the second light receiving circuit than the selection transistor.

* * * * *